US010505517B2

(12) United States Patent
Na et al.

(10) Patent No.: US 10,505,517 B2
(45) Date of Patent: *Dec. 10, 2019

(54) RADIO FREQUENCY SWITCH CIRCUIT AND APPARATUS HAVING BUILT-IN COUPLER

(71) Applicant: Samsung Electro-Mechanics Co., Ltd., Suwon-si (KR)

(72) Inventors: Yoo Sam Na, Suwon-si (KR); Jong Mo Lim, Suwon-si (KR); Yoo Hwan Kim, Suwon-si (KR); Hyun Hwan Yoo, Suwon-si (KR); Hyun Jin Yoo, Suwon-si (KR); Seong Jong Cheon, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/028,965

(22) Filed: Jul. 6, 2018

(65) Prior Publication Data

US 2018/0316334 A1 Nov. 1, 2018

Related U.S. Application Data

(63) Continuation of application No. 15/390,849, filed on Dec. 27, 2016, now Pat. No. 10,044,341.

(30) Foreign Application Priority Data

Jul. 7, 2016 (KR) .................. 10-2016-0086254
Nov. 18, 2016 (KR) .................. 10-2016-0154330

(51) Int. Cl.
*H01P 5/18* (2006.01)
*H01P 1/10* (2006.01)
(Continued)

(52) U.S. Cl.
CPC .......... *H03H 11/34* (2013.01); *H01L 23/66* (2013.01); *H03H 11/28* (2013.01); *H01L 2223/6605* (2013.01); *H01L 2223/6677* (2013.01)

(58) Field of Classification Search
CPC .............. H01P 1/15; H01P 5/18; H03H 11/34
(Continued)

(56) References Cited

U.S. PATENT DOCUMENTS 9,391,657 B2 7/2016 Iwanaga
10,044,341 B2* 8/2018 Na .................. H01L 23/66
2008/0136559 A1 6/2008 Takahashi et al.

FOREIGN PATENT DOCUMENTS

CN 1605154 A 4/2005
CN 1957534 A 5/2007
(Continued)

OTHER PUBLICATIONS

Chinese Office Action dated Apr. 2, 2019 in counterpart Chinese Patent Application No. 201710059492.5 (8 pages in English and 6 pages in Chinese).

(Continued)

*Primary Examiner* — Dean O Takaoka
(74) *Attorney, Agent, or Firm* — NSIP Law

(57) ABSTRACT

A radio frequency switch circuit is described including a radio frequency switch and a coupler. The radio frequency switch includes a first band switch circuit connected between a first signal port and a common port, and configured to switch a first band signal. The coupler includes a first coupling wiring, disposed adjacent to a signal wiring formed between the common port of the radio frequency switch and an antenna port, and configured to form a first coupling signal with the signal wiring. A resonant frequency of the first coupling wiring is based on an inductance of the first (Continued)

coupling wiring and a capacitance of the radio frequency switch.

22 Claims, 10 Drawing Sheets

(51) Int. Cl.
    *H03H 11/34*     (2006.01)
    *H01L 23/66*     (2006.01)
    *H03H 11/28*     (2006.01)

(58) Field of Classification Search
    USPC .............................. 333/109–112, 116, 24 R
    See application file for complete search history.

(56) References Cited

FOREIGN PATENT DOCUMENTS

| | | |
|---|---|---|
| CN | 101197461 A | 6/2008 |
| CN | 103814526 A | 5/2014 |
| CN | 104579407 A | 4/2015 |
| EP | 1 289 159 A2 | 3/2003 |
| JP | 10-93302 A | 4/1998 |
| JP | 2003-78441 A | 3/2003 |
| JP | 2006-191663 A | 7/2006 |
| JP | 2013-46305 A | 3/2013 |
| JP | 2013-183351 A | 9/2013 |
| JP | 2015-523810 A | 8/2015 |
| KR | 10-0430824 B1 | 5/2004 |
| WO | WO 03/055065 A1 | 7/2003 |
| WO | WO 2005/114854 A1 | 12/2005 |
| WO | WO 2008/066325 A1 | 6/2008 |
| WO | WO 2010/091697 A1 | 8/2010 |
| WO | WO 2013/041146 A1 | 3/2013 |
| WO | WO 2014/011510 A2 | 1/2014 |

OTHER PUBLICATIONS

Korean Office Action dated Jun. 8, 2017 in the corresponding Korean Patent Application No. 10-2016-0154330. (5 pages in English and 4 pages in Korean).

Japanese Office Action dated May 8, 2018, in corresponding Japanese Application No. 2017-017747 (3 pages in English, 2 pages in Japanese).

\* cited by examiner

RADIO FREQUENCY SWITCH CIRCUIT AND APPARATUS HAVING BUILT-IN COUPLER

CROSS-REFERENCE TO RELATED APPLICATION(S)

This application is a Continuation Application based on U.S. application Ser. No. 15/390,849, filed on Dec. 27, 2016, which claims the benefit under USC 119(a) of Korean Patent Application Nos. 10-2016-0086254 and 10-2016-0154330, filed on Jul. 7, 2016 and Nov. 18, 2016, respectively, in the Korean Intellectual Property Office, the entire disclosures of which are incorporated herein by reference for all purposes.

BACKGROUND

1. Field

The following description relates to a radio frequency switch circuit and apparatus having a built-in coupler for use in a time division multiplexing (TDM) communications system.

2. Description of Related Art

In general, in various communications systems using a time division multiplexing (TDM) scheme, an antenna radio frequency (RF) switch is used between a transmitter and a receiver. In addition, in a communications system performing multiple communications, a band selection radio frequency (RF) switch is used between an antenna and a duplexer in order to switch between band signals.

The antenna RF switch described above alternately switches the transmitter and the receiver on and off, thus, decreasing the entire power consumption of a system and decreasing interference between the transmitter and the receiver. In addition, the band selection RF switch selectively switches multiple bands on and off, thus, decreasing the entire power consumption of a system and decreasing interference between the bands.

The RF switch described above may be used in communications systems such as Bluetooth, cellular personal communications service (PCS), code division multiple access (CDMA), wideband CDMA (WCDMA), time division multiple access (TDMA), global system for mobile communications (GSM), and wireless local area network (WLAN).

The RF switch requires performance characteristics such as low insertion loss, high power handling capability, high isolation, and the like.

In addition, an existing communications system includes a coupler to monitor an output signal of a power amplifier (PA).

The coupler, however, has some operational disadvantages such as mismatching between antenna impedances and signal loss. The coupler may be used, however, to control an output signal and control an input signal to improve efficiency of an entire system, and thus allow for an increase in a battery discharge time and system adjustment.

However, existing communications systems may include a coupler implemented or positioned separately from the RF switch, the RF switch may be implemented as an integrated circuit (IC), and the coupler may be formed as a printed circuit board (PCB) pattern on a PCB or may be mounted as an individual component on a board or the PCB.

A coupler has a coupling factor, which can represent how much power is provided to a coupled port of the coupler relative to the power of an RF signal at the power input port. Such coupler typically causes an insertion loss in an RF signal path. Thus, an RF signal received at a power input port of the coupler can have a lower power when provided at the power output port of the coupler. Insertion loss can be due to a portion of the RF signal being provided to the coupled port (or to the isolated port) and/or to losses associated with the main transmission line of the coupler. Thus, as described above, in a configuration in which a PCB-based coupler is implemented external to the RF switch, separately from an IC type RF switch, an area occupied by the PCB-based coupler is large, and efficiency is decreased due to the large loss of the coupler.

In addition, in a case in which the communications system includes a bi-directional coupler to transmit/receive (Tx/Rx) coupling separately from the RF switch, the bi-directional coupler may detect bi-directional signals (forward and reverse signals). However, the bi-directional coupler occupies a large area in a communications module depending on a frequency being used. Also, efficiency of the power amplifier (PA) is further decreased due to line loss caused by implementation of the PCB.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a radio frequency switch apparatus having a built-in coupler that has a decreased occupied area and a size, and has an improved coupling characteristics using capacitances of switch devices in a switch-off state among switch devices included in a radio frequency switch circuit. The radio frequency switch apparatus includes an integrated circuit (IC) including a radio frequency switch and the coupler.

In accordance with an embodiment, there is provided a radio frequency switch circuit, including: a radio frequency switch may include a first band switch circuit connected between a first signal port and a common port, and configured to switch a first band signal; and a coupler may include a first coupling wiring, disposed adjacent to a signal wiring formed between the common port of the radio frequency switch and an antenna port, and configured to form a first coupling signal with the signal wiring, wherein a resonant frequency of the first coupling wiring may be based on an inductance of the first coupling wiring and a capacitance of the radio frequency switch.

The first band switch circuit may include a first series switch circuit connected between the first signal port and the common port, and a first shunt switch circuit connected between the first signal port and a ground, and the resonant frequency of the first coupling wiring may be based on the inductance of the first coupling wiring and a capacitance of the first shunt switch circuit in a switch-off state.

The coupler further may include a second coupling wiring spaced apart from the first coupling wiring and adjacent to the signal wiring and the antenna port to form a second coupling signal with the signal wiring, and a resonant frequency of the second coupling wiring may be based on an inductance of the second coupling wiring and a capacitance of the first band switch circuit.

The first band switch circuit may include a first series switch circuit connected between the first signal port and the common port, and a first shunt switch circuit connected between the first signal port and a ground, and the resonant frequency of the second coupling wiring may be based on the inductance of the second coupling wiring and a capacitance of the first shunt switch circuit in a switch-off state.

The resonant frequency of the first coupling wiring may coincide with a frequency of the first band signal transmitted from the first band switch circuit based on the inductance of the first coupling wiring and a capacitance of the first shunt switch circuit in a switch-off state.

The resonant frequency of the first coupling wiring may be based on a capacitance of the first shunt switch circuit in a switch-off state, and a mutual capacitance and a mutual inductance between the signal wiring and the first coupling wiring.

A resonant frequency of the coupler may be based on $$Fres = \frac{1}{2\pi * Coff}\left(\sqrt{\frac{Cm}{Lm}} - \frac{1}{Zo}\right),$$

where Coff may be a capacitance of the first shunt switch circuit in a switch-off state, Cm may be a mutual capacitance between the signal wiring and the first coupling wiring, Lm may be a mutual inductance between the signal wiring and the first coupling wiring, and Zo may be an intrinsic impedance of the first signal port.

The radio frequency switch and the coupler may be integrally formed on an integrated circuit board.

In accordance with an embodiment, there is provided a radio frequency switch apparatus, including: a radio frequency switch may include a first band switch circuit connected between a first signal port and a common port, and configured to switch a first band signal; a coupler may include a first coupling wiring disposed adjacent to a signal wiring formed between the interstage matching circuit and an antenna port to form a first coupling signal with the signal wiring; and an interstage matching circuit connected to the common port and configured to perform impedance matching between the radio frequency switch and the coupler, wherein a resonant frequency of the first coupling wiring may be based on an inductance of the first coupling wiring and a capacitance of the radio frequency switch.

The first band switch circuit may include a first series switch circuit connected between the first signal port and the common port and a first shunt switch circuit connected between the first signal port and a ground, and the resonant frequency of the first coupling wiring may be based on the inductance of the first coupling wiring and a capacitance of the first shunt switch circuit in a switch-off state.

The coupler further may include a second coupling wiring spaced apart from the first coupling wiring, and adjacent to the signal wiring and the antenna port to form a second coupling signal with the signal wiring, and a resonant frequency of the second coupling wiring may be based on an inductance of the second coupling wiring and a capacitance of the first band switch circuit.

The first band switch circuit may include a first series switch circuit connected between the first signal port and the common port and a first shunt switch circuit connected between the first signal port and a ground, and the resonant frequency of the second coupling wiring may be based on the inductance of the second coupling wiring and a capacitance of the first shunt switch circuit in a switch-off state.

The resonant frequency of the first coupling wiring coincides with a frequency of the first band signal transmitted from the first band switch circuit based on the inductance of the first coupling wiring and a capacitance of the first shunt switch circuit in a switch-off state.

The resonant frequency of the first coupling wiring may be based on a capacitance of the first shunt switch circuit in a switch-off state, and a mutual capacitance and a mutual inductance between the signal wiring and the first coupling wiring.

A resonant frequency of the coupler may be based on $$Fres = \frac{1}{2\pi * Coff}\left(\sqrt{\frac{Cm}{Lm}} - \frac{1}{Zo}\right),$$

where Coff may be a capacitance of the first shunt switch circuit in the switch-off state, Cm may be the mutual capacitance between the signal wiring and the first coupling wiring, Lm may be the mutual inductance between the signal wiring and the first coupling wiring, and Zo may be an intrinsic impedance of the first signal port.

The radio frequency switch and the coupler may be integrally formed on an integrated circuit board.

In accordance with an embodiment, there is provided an apparatus, including: a first band switch circuit may include a first series switch circuit and a first shunt switch circuit, wherein the first series switch circuit may be connected between a signal port and a common port; and a coupler may include a signal wiring may include one end connected to the common port and another end connected to an antenna port, and a first coupling wiring disposed coextensive to the signal wiring to form a coupling with the signal wiring and configured to produce a first coupling signal, wherein a resonant frequency of the first coupling wiring may be based on an inductance of the first coupling wiring and a capacitance of the first shunt switch circuit in a switch-off state.

The first coupling wiring may be disposed between a first detection port and a resistor.

In response to the first shunt switch circuit being in the switch-off state and the first series switch circuit being in a switch-on state, the first band switch circuit transmits a first band signal to the coupler.

The apparatus may further include a second coupling wiring disposed coextensive to the signal wiring, diametrically opposite to the first coupling wiring, and configured to form a coupling with the signal wiring and produce a second coupling signal to monitor signal reception strength.

The apparatus may further include an output matching circuit disposed between the coupler and an antenna terminal configured to match an impedance of the first band switch circuit and match an impedance of the antenna terminal and an impedance of the coupler to each other to decrease transfer loss of signals.

The impedance of the coupler may be different from the impedance of the first band switch circuit.

The apparatus may further include a radio frequency switch may include the first band switch circuit and connected between the signal port and the common port; and an interstage matching circuit disposed between the radio frequency switch and the coupler configured to match impedances between the radio frequency switch and the coupler.

The signal wiring may be disposed on a first layer of an integrated circuit, the first and second coupling wirings may be disposed on a second layer of the integrated circuit, and corresponding resistors of the first and second coupling wirings, corresponding grounds of the first and second coupling wirings, and a ground part of the integrated circuit may be disposed on a third layer of the integrated circuit.

The second layer may be disposed below the first layer, and the third layer may be disposed below the second layer.

The first and second coupling wirings may be disposed on a layer of an integrated circuit different from a layer on which a ground part of the integrated circuit may be disposed to relatively increase a distance between the first and second coupling wirings and the ground part of the integrated circuit.

In accordance with another embodiment, there is provided an apparatus, including: a first band switch circuit may include a first series switch circuit and a first shunt switch circuit, wherein the first series switch circuit may be connected between a signal port and a common port; and a coupler may include a signal wiring may include one end connected to the common port and another end connected to an antenna port, and a first coupling wiring disposed coextensive to the signal wiring to form a coupling with the signal wiring and configured to produce a first coupling signal, wherein a resonant frequency of the first coupling wiring may be determined based on a capacitance of the first shunt switch circuit in a switch-off state, and a mutual capacitance and a mutual inductance between the signal wiring and the first coupling wiring.

The first coupling wiring and the signal wiring may be coupled to each other to form the mutual capacitance and the mutual inductance between the first coupling wiring and the signal wiring.

The first shunt switch circuit may be connected between the signal port and a ground, and the first shunt switch circuit changes from a switch-on state to the switch-off state based on a second gate signal of the first shunt switch circuit.

In response to the first shunt switch circuit being in the switch-off state and the first series switch circuit being in a switch-on state, the first band switch circuit transmits a first band signal to the coupler.

The resonant frequency, Fres, may be based on a following relationship $$Fres = \frac{1}{2\pi * Coff}\left(\sqrt{\frac{Cm}{Lm}} - \frac{1}{Zo}\right),$$

where, Coff may be the capacitance of the first shunt switch circuit in the switch-off state, Cm may be the mutual capacitance between the signal wiring and the first coupling wiring, Lm may be the mutual inductance between the signal wiring and the first coupling wiring, and Zo may be an intrinsic impedance of the signal port.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
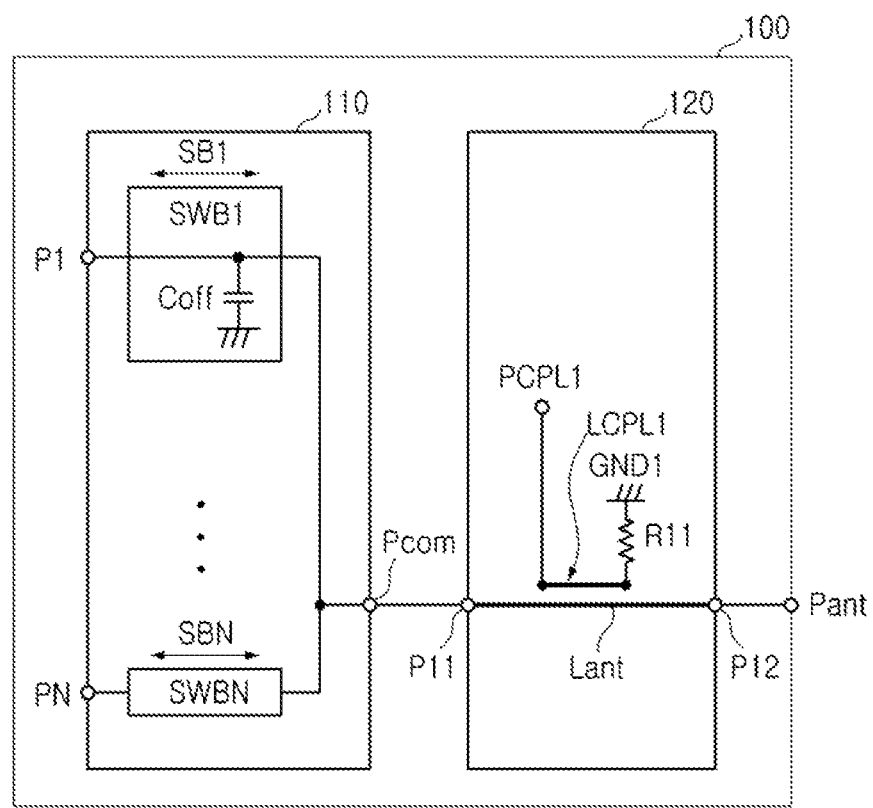
FIG. 1 is a schematic view illustrating a radio frequency switch circuit having a built-in coupler, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, element, feature, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a schematic view illustrating a radio frequency switch circuit having a built-in coupler, according to an embodiment.

Referring to FIG. 1, the radio frequency switch circuit 100 having a built-in coupler, according to an embodiment, includes a radio frequency switch 110 and a coupler 120.

The radio frequency switch 110 includes at least one first band switch circuit SWB1, connected between at least one first signal port P1 and a common port Pcom. The first band switch circuit SWB1 includes a capacitor Coff. The radio frequency switch 110 is configured to switch a first band signal SB1 received at the first signal port P1.

In some embodiments, the radio frequency switch 110 includes one first band switch circuit SWB1. Alternatively, the radio frequency switch 110 may include first to N-th band switch circuits SWB1 to SWBN (here, N indicates a natural number of 2 or more).

In this alternative embodiment, the first band switch circuit SWB1 may be connected between the first signal port P1 and the common port Pcom, and may switch the first band signal SB1, while the N-th band switch circuit SWBN may be connected between an N-th signal port PN and the common port Pcom, and may switch an N-th band signal SBN.

Because the radio frequency switch 110 is similarly applied to the various embodiments described, an overlapping description for the radio frequency switch 110 will be omitted to avoid redundancy.

The coupler 120 includes a first coupling wiring LCPL1 between a first detection port PCPL1 and an end point of a resistor R11, which is grounded GND1 at another end thereof. The first coupling wiring LCPL1 is disposed adjacent to, coextensive to, parallel to, substantially proximate to, or near to a signal wiring Lant to form a first coupling signal with the signal wiring Lant. The signal wiring Lant is positioned within the coupler 120, between one end P11 and another end P12, as shown in FIG. 1. The coupler 120 is formed, positioned, or disposed between the common port Pcom of the radio frequency switch 110 and an antenna port Pant to form a coupling with the signal wiring Lant and output a first coupling signal from the first detection port PCPL1.

In this case, a resonant frequency Fres from the first coupling wiring LCPL1 is determined by an inductance of the first coupling wiring LCPL1 and a capacitance Coff of the radio frequency switch 110.

In an example, the one end P11 of the signal wiring Lant is connected to the common port Pcom of the radio frequency switch 110, and the other end P12 of the signal wiring Lant is connected to the antenna port Pant.

Figure 2:
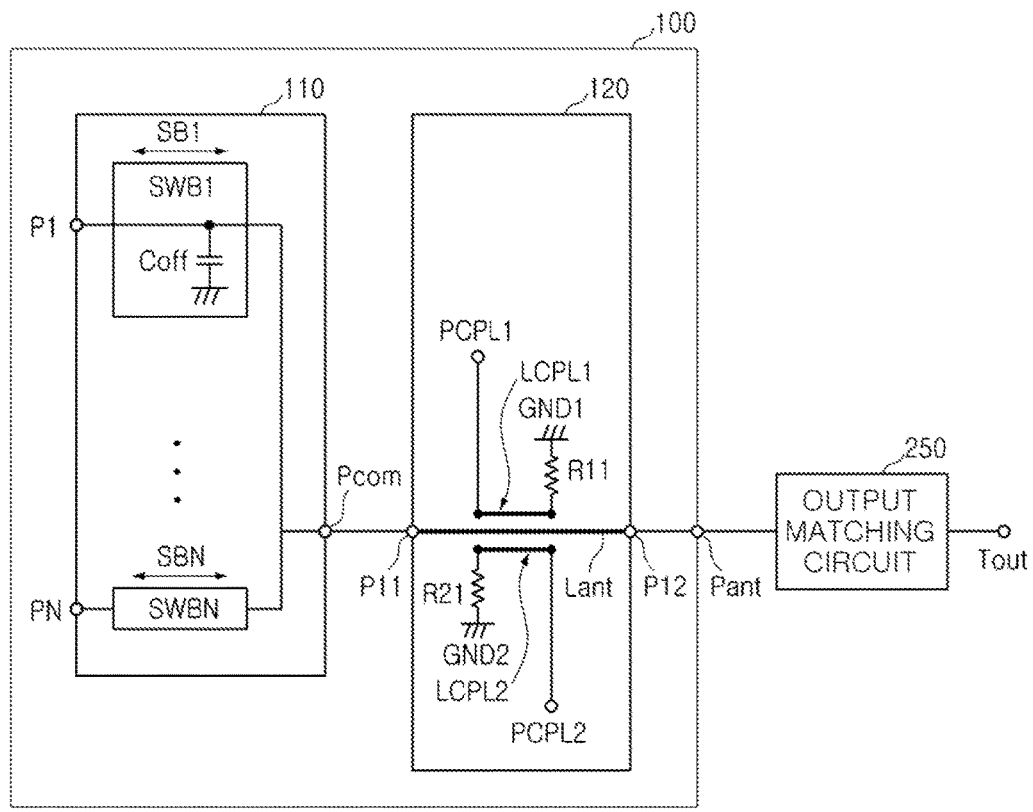
FIG. 2 is a schematic view illustrating a radio frequency switch apparatus having the built-in coupler, according to an embodiment.

FIG. 2 is a schematic view illustrating a radio frequency switch apparatus having the built-in coupler, according to an embodiment.

Referring to FIG. 2, the radio frequency switch apparatus having a built-in coupler includes a radio frequency switch circuit 100 and an output matching circuit 250.

The coupler 120 of the radio frequency switch circuit 100 includes a second coupling wiring LCPL2, in addition to a structure illustrated in FIG. 1.

The second coupling wiring LCPL2 is disposed between a first detection port PCPL2 and an end point of a resistor R21, which is grounded GND2 at another end thereof. The second coupling wiring LCPL2 is disposed adjacent to, coextensive to, parallel to, substantially proximate to, or near to the signal wiring Lant described with reference to FIG. 1 to form a second coupling signal with the signal wiring Lant.

In an example, a resonant frequency Fres from the second coupling wiring LCPL2 is determined by an inductance of the second coupling wiring LCPL2 and the capacitance Coff of the first band switch circuit SWB1.

The output matching circuit 250 is connected between the antenna port Pant of the radio frequency switch circuit 100 and an antenna terminal Tout to which an antenna is connected, and may match impedances between the antenna port Pant and the antenna terminal Tout to decrease transfer loss of signals.

Referring to FIGS. 1 and 2, the radio frequency switch circuit 100 having a built-in coupler includes the radio frequency switch 110 and the coupler 120 and is formed on one or a single integrated circuit board using a same manufacturing process as to be implemented when forming a single integrated circuit.

As an example, the integrated circuit is an integrated circuit using a semiconductor board such as a silicon-on-insulator (SOI), or the like, and, for example, in an embodiment in which a semiconductor board is used such as the SOI, or the like, loss may be decreased due to high resistive board characteristics. The radio frequency switch 110 and the coupler 120 may be disposed as adjacent to, coextensive to, parallel to, substantially proximate to, or near to each other as possible to significantly decrease insertion loss.

Therefore, when the radio frequency switch circuit 100 having a built-in coupler, according to the embodiment, is used, the insertion loss is reduced, and an area occupied by the coupler and a size of the coupler is decreased.

As previously explained, the first coupling wiring LCPL1 of the coupler 120 are connected to the first detection port PCPL1 and the first resistor R11.

The first detection port PCPL1 is connected to one end of the first coupling wiring LCPL1 disposed adjacent to, coextensive to, parallel to, substantially proximate to, or near to the common port Pcom, and output a first coupling signal coupled from the signal wiring Lant. In an example, the first coupling signal provided through the first coupling wiring LCPL1 may be used as a signal for monitoring transmission power.

The first resistor R11 is connected between the other end of the first coupling wiring LCPL1 disposed adjacent to, coextensive to, parallel to, substantially proximate to, or near to the antenna port Pant and the ground GND1, and matches impedances to each other. In an example, the first resistor R11, which is a resistor for matching impedances to each other, is set to 50Ω.

In addition, the second coupling wiring LCPL2 of the coupler 120 is connected between the second detection port PCPL2 and the second resistor R21.

The second detection port PCPL2 is connected to one end of the second coupling wiring LCPL2 disposed adjacent to, coextensive to, parallel to, substantially proximate to, or near to the antenna port Pant, and outputs a second coupling signal coupled from the signal wiring Lant. In an example, the second coupling signal provided through the second coupling wiring LCPL2 is used as a signal to monitor reception strength. The second coupling wiring LCPL2 is diametrically opposite to the first coupling wiring LCPL1 or on another side of the signal wiring Lant on which the first coupling wiring LCPL1 is disposed.

The second resistor R21 is connected between the other end of the second coupling wiring LCPL2 disposed adjacent to, coextensive to, parallel to, substantially proximate to, or near to the common port Pcom and a ground, and match impedances to each other. In an example, the second resistor R21, which is a resistor for matching impedances to each other, may be set to 50Ω as an example.

As described above, an area occupied by the coupler and a size of the coupler is decreased and loss of the coupler itself is improved. In an example in which the coupler 120 is implemented together with the radio frequency switch 110 by the integrated circuit IC, as compared to an example in which the coupler 120 is formed as a printed circuit board (PCB) pattern on a board, or is mounted as an individual coupler device as a board.

As illustrated in FIGS. 1 and 2, in an integrated circuit including the radio frequency switch 110 and the coupler 120, an impedance of the coupler 120 connected to the antenna terminal, of which an impedance is 50Ω, and an impedance of the radio frequency switch 110 may not coincide with each other. As an example, the impedance of the radio frequency switch 110 is not 50Ω, and because the coupler 120 is connected to the antenna terminal, the impedance of the coupler 120 is 50Ω, which is the same as that of the antenna terminal.

In this example, an output matching circuit 250 is disposed between the coupler 120 and the antenna terminal Tout in order to match the impedance of the radio frequency switch 110 and the impedance of the antenna terminal and the coupler 120 to each other. Although the output matching circuit 250 is illustrated in FIG. 2 as being external to the radio frequency switch apparatus 100, in an alternative embodiment, the output matching circuit 250 may be integrated within the radio frequency switch apparatus 100.

Therefore, the output matching circuit 250 matches the impedance between the radio frequency switch circuit 100 and the antenna terminal Tout. As a result, the impedance is matched between the radio frequency switch 110 and the coupler 120, and the impedance is matched between the coupler 120 and the antenna terminal.

Figure 3:
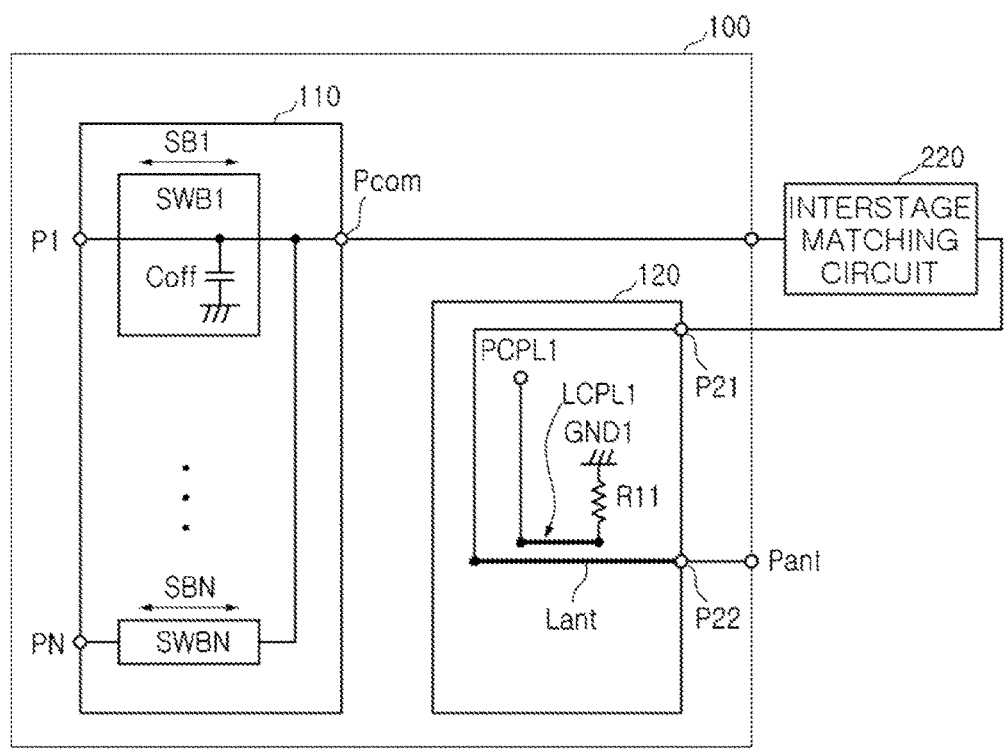
FIG. 3 is another schematic view illustrating a radio frequency switch apparatus having a built-in coupler, according to an embodiment.

FIG. 3 is another schematic view illustrating a radio frequency switch apparatus having a built-in coupler, according to an embodiment.

Referring to FIG. 3, the radio frequency switch apparatus having a built-in coupler, according to an embodiment, includes a radio frequency switch circuit 100 and an interstage matching circuit 220. Although the interstage matching circuit 220 is illustrated in FIG. 3 as being external to the radio frequency switch apparatus 100, in an alternative embodiment, the interstage matching circuit 220 may be integrated within the radio frequency switch apparatus 100.

The radio frequency switch circuit 100 is the same as the radio frequency switch circuit described with reference to FIGS. 1 and 2, and thus, a detailed description therefor will be omitted.

The coupler 120 includes a first coupling wiring LCPL1. The first coupling wiring LCPL1 is disposed adjacent to, coextensive to, parallel to, substantially proximate to, or near to a signal wiring Lant formed between the interstage matching circuit 220 and an antenna port Pant to form a first coupling signal with a portion of the signal wiring Lant. In an example, one end P21 of the signal wiring Lant is connected to the interstage matching circuit 220, and the other end P22 of the signal wiring Lant is connected to the antenna port Pant.

The interstage matching circuit 220 is connected between the common port Pcom of the radio frequency switch 110 and the coupler 120. The interstage matching circuit 220 is configured to match impedances between the radio frequency switch 110 and the coupler 120.

In addition, a resonant frequency Fres from the first coupling wiring LCPL1 is determined by an inductance of the first coupling wiring LCPL1 and a capacitance Coff of the radio frequency switch 110.

Figure 4:
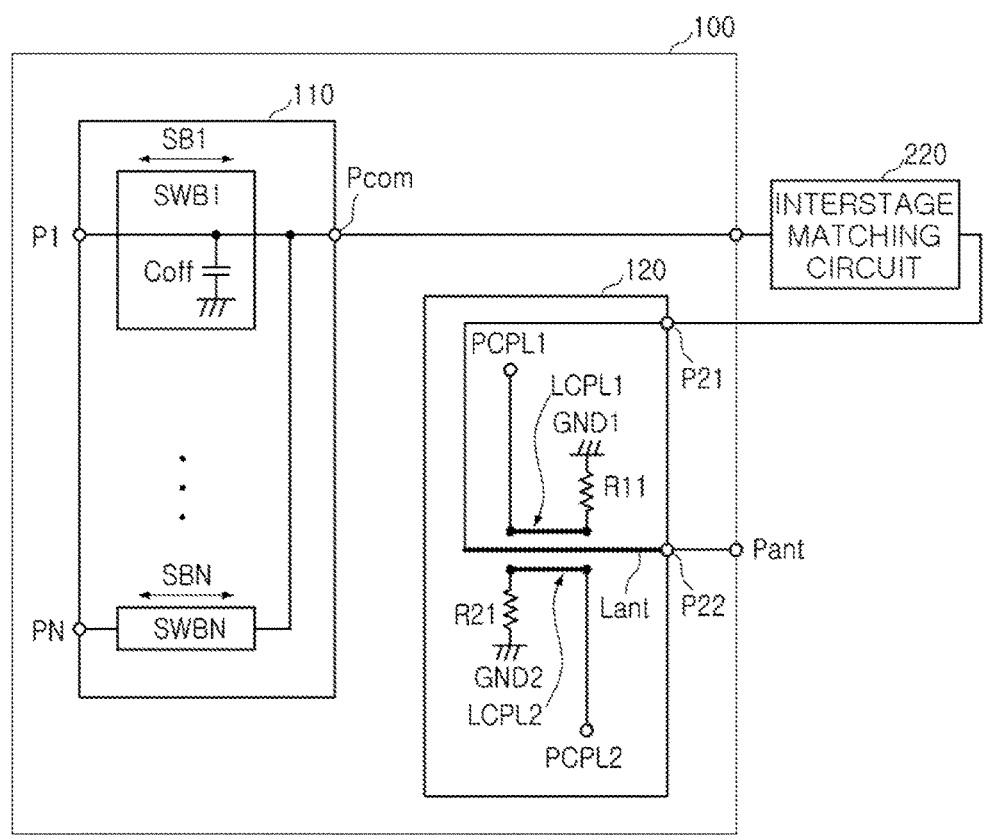
FIG. 4 is another schematic view illustrating a radio frequency switch apparatus having the built-in coupler, according to an embodiment.

FIG. 4 is another schematic view illustrating a radio frequency switch apparatus having the built-in coupler, according to an embodiment.

Referring to FIG. 4, the radio frequency switch apparatus having a built-in coupler according to the exemplary embodiment includes a radio frequency switch circuit 100 and an interstage matching circuit 220.

The coupler 120 of the radio frequency switch circuit 100 also includes a second coupling wiring LCPL2, in addition to a structure illustrated in FIG. 3.

The second coupling wiring LCPL2 may be disposed adjacent to the signal wiring Lant, described with reference to FIG. 3, to form second coupling signal with the signal wiring Lant.

In an example, a resonant frequency Fres by the second coupling wiring LCPL2 is determined by an inductance of the second coupling wiring LCPL2 and a capacitance Coff of the first band switch circuit SWB1.

The interstage matching circuit 220 is connected between the common port Pcom of the radio frequency switch 110 and the coupler 120. The interstage matching circuit 220 is configured to match impedances between the radio frequency switch 110 and the coupler 120.

Furthermore, as illustrated in FIGS. 3 and 4, in an integrated circuit including the radio frequency switch 110 and the coupler 120, an impedance of the coupler 120 connected to the antenna terminal, of which an impedance is 50Ω, does not coincide with or is different from the impedance of the radio frequency switch 110. As an example, the impedance of the radio frequency switch 110 is not 50Ω, and because the coupler 120 is connected to an antenna, the impedance of the coupler 120 is 50Ω, which is the same as the impedance of the antenna terminal.

In an example, the interstage matching circuit 220 is disposed between the radio frequency switch 110 and the coupler 120 in order to match impedances between the radio frequency switch 110 and the coupler 120. In an example, the interstage matching circuit 220 is disposed outside the integrated circuit including the radio frequency switch 110 and the coupler 120.

The interstage matching circuit 220 is connected between the radio frequency switch 110 and the coupler 120. The interstage matching circuit 220 is configured to match impedances between the radio frequency switch 110 and the coupler 120.

Figure 5:
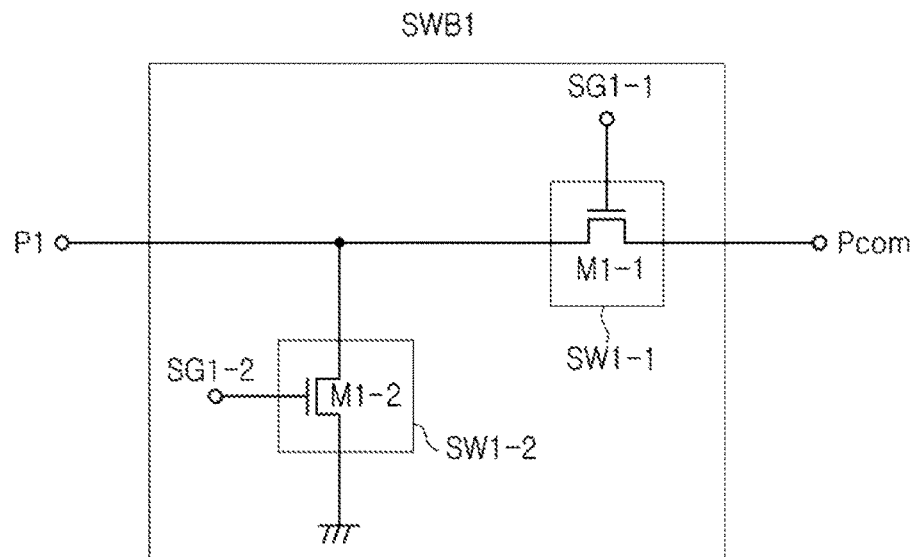
FIG. 5 is a schematic view illustrating a first band switch circuit, according to an embodiment.
Figure 6:
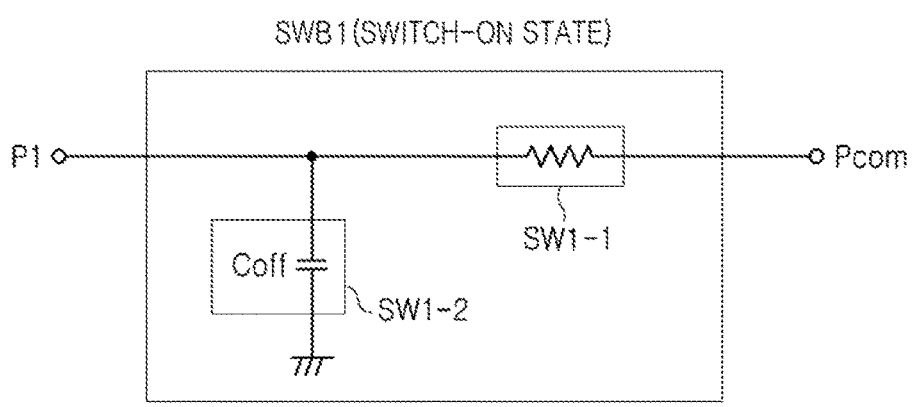
FIG. 6 is an equivalent circuit diagram of a switch-on state of the first band switch circuit of FIG. 5.
Figure 7:
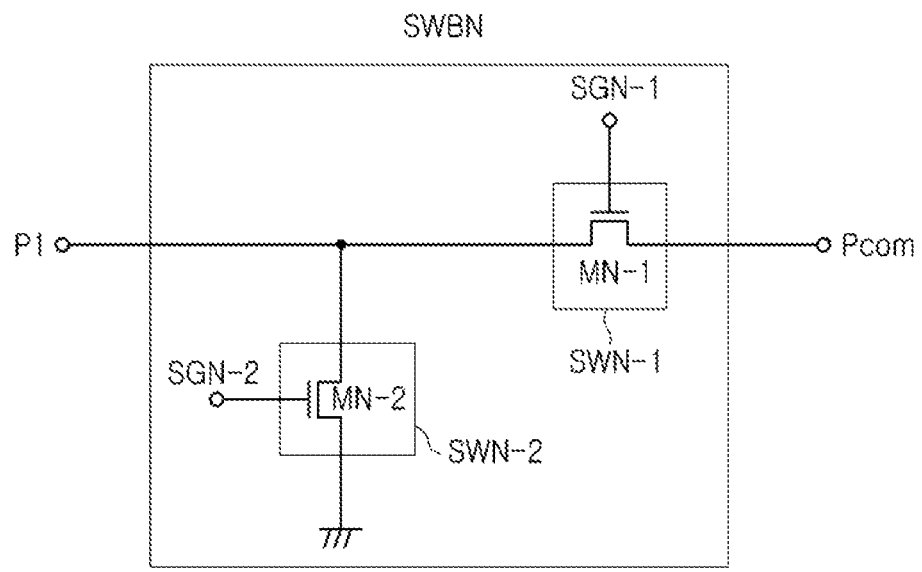
FIG. 7 is a schematic view illustrating an N-th band switch circuit, according to an embodiment.
Figure 8:
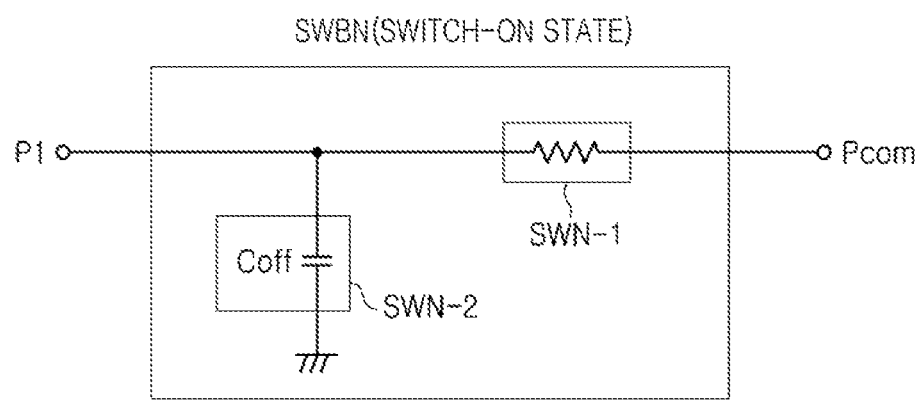
FIG. 8 is an equivalent circuit diagram of a switch-on state of the N-th band switch circuit of FIG. 7.

FIG. 5 is a schematic view illustrating a first band switch circuit, according to an embodiment; FIG. 6 is an equivalent circuit diagram of a switch-on state of the first band switch circuit of FIG. 5; FIG. 7 is a schematic view illustrating an N-th band switch circuit, according to an embodiment; and FIG. 8 is an equivalent circuit diagram of a switch-on state of the N-th band switch circuit of FIG. 7.

Referring to FIGS. 5 and 6, the first band switch circuit SWB1 includes a first series switch circuit SW1-1 and a first shunt switch circuit SW1-2.

The first series switch circuit SW1-1 is connected between the first signal port P1 and a common port Pcom, and changes from a switch-on state to a switch-off state, and vice-versa, depending on a first gate signal SG1-1. As an example, the first series switch circuit SW1-1 includes one or more switch devices M1-1, such as a metal oxide semiconductor field effect transistor (MOSFET), N-channel MOSFET, or P-channel MOSFET, connected in series between the first signal port P1 and the common port Pcom.

The first shunt switch circuit SW1-2 is connected between the first signal port P1 and a ground, and changes from a switch-on state to a switch-off state, and vice-versa, depending on a second gate signal SG1-2. As an example, the first shunt switch circuit SW1-2 includes one or more switch devices M1-2, such as a MOSFET, N-channel MOSFET, or P-channel MOSFET, connected in series between the first signal port P1 and the ground.

Further, the switch devices M1-1 and M1-2 may be metal oxide semiconductor (MOS) transistors, and types of MOS transistors are not particularly limited.

In this example, in order for the first band switch circuit SWB1 to transfer the first band signal SB1, the first shunt switch circuit SW1-2 changes to a switch-off state, based on a low voltage level of the second gate signal SG1-2 in response to the first series switch circuit SW1-1 being in a switch-on state, based on a high voltage level of the first gate signal SG1-1. In this case, the first shunt switch circuit SW1-2 in the switch-off state has a capacitance Coff.

Further, a resonant frequency Fres by the first coupling wiring LCPL1 is determined by an inductance of the first coupling wiring LCPL1 and a capacitance Coff of the first shunt switch circuit SW1-2 in the switch-off state.

In contrast, in order for the first band switch circuit SWB1 to block the first band signal SB1, the first shunt switch circuit SW1-2 changes to a switch-on state, depending on a high voltage level of the second gate signal SG1-2 in response to the first series switch circuit SW1-1 being in a switch-off state, and depending on a low voltage level of the first gate signal SG1-1.

Referring to FIGS. 7 and 8, the N-th band switch circuit SWBN includes an N-th series switch circuit SWN-1 and an N-th shunt switch circuit SWN-2.

The N-th series switch circuit SWN-1 is connected between the N-th signal port PN and a common port Pcom, and changes from a switch-on state to a switch-off state, and vice-versa, depending on a first gate signal SGN-1. As an example, the N-th series switch circuit SWN-1 includes one or more switch devices MN-1, such as a MOSFET, N-channel MOSFET, or P-channel MOSFET, connected in series between the N-th signal port PN and the common port Pcom.

The N-th shunt switch circuit SWN-2 is connected between the N-th signal port PN and a ground, and changes from a switch-on state to a switch-off state, and vice-versa, depending on a second gate signal SGN-2. As an example, the N-th shunt switch circuit SWN-2 includes one or more switch devices MN-2, such as a MOSFET, N-channel MOSFET, or P-channel MOSFET, connected in series between the N-th signal port PN and the ground.

In an embodiment, the one or more switch devices MN-1 and MN-2 may be MOS transistors, and types of MOS transistors are not particularly limited.

In an embodiment, in order for the N-th band switch circuit SWBN to transfer the N-th band signal SBN, the N-th shunt switch circuit SWN-2 changes to a switch-off state based on a low voltage level of the second gate signal SGN-2 in response to the N-th series switch circuit SWN-1 being in a switch-on state based on a high voltage level of the first gate signal SGN-1. In this embodiment, the N-th shunt switch circuit SWN-2 in the switch-off state has a capacitance Coff.

In this embodiment, a resonant frequency Fres by the first coupling wiring LCPL1 is based on or is determined by an inductance of the first coupling wiring LCPL1 and a capacitance Coff of the N-th shunt switch circuit SWN-2 in the switch-off state.

Further, in contrast, in order for the N-th band switch circuit SWBN to block the N-th band signal SBN, the N-th shunt switch circuit SWN-2 changes to a switch-on state, based on a high voltage level of the second gate signal SGN-2 in response to the N-th series switch circuit SWN-1 being in a switch-off state, based on a low voltage level of the first gate signal SGN-1.

Referring to FIGS. 5 through 8, the number of semiconductor switch devices included in each of the first to N-th shunt switch circuits SW1-2 to SWN-2 may be determined by considering an entire capacitance Coff of switch devices in a switch-off state in the corresponding shunt switch circuits determining the resonant frequency Fres of the coupler 120, because capacitances of the respective semiconductor switch devices in the switch-off state are summed up to have an influence on the resonant frequency Fres of the coupler 120.

Referring to FIGS. 5 through 8, the resonant frequency Fres by the first coupling wiring LCPL1 may coincide with a frequency of the first band signal SB1 transferred through the first band switch circuit SWB1 by the inductance of the first coupling wiring LCPL1 and the capacitance Coff of the first shunt switch circuit SW1-2 in the switch-off state.

In a respective embodiments, the coupler 120 may be formed on a single-layer semiconductor board or may be formed on a multilayer semiconductor board in order to be manufactured in a smaller size, an example of which will be described with reference to FIGS. 9A through 9C.

Figure 9A:
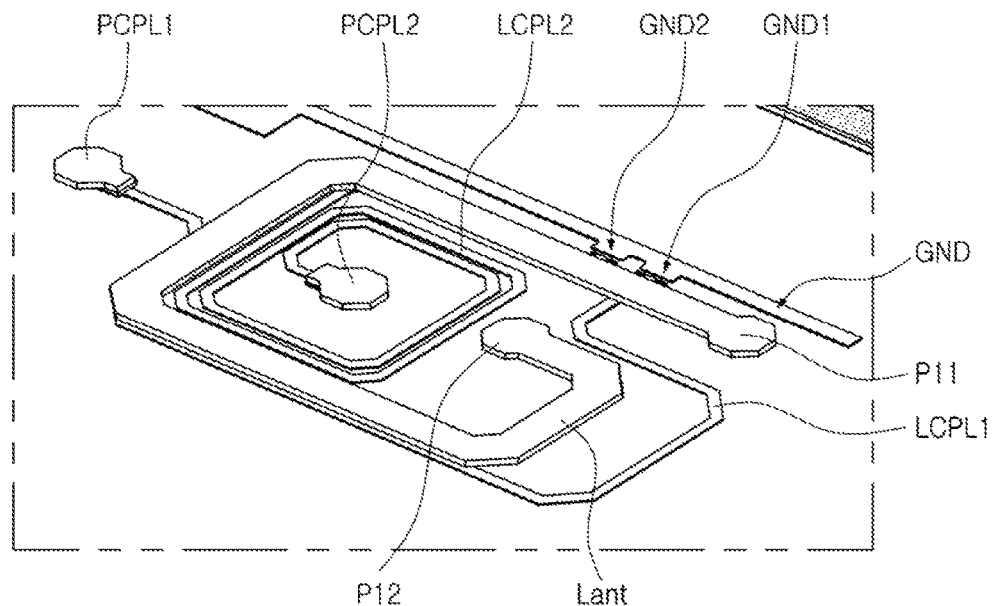
FIGS. 9A through 9C are schematic views illustrating the coupler of FIG. 2.
Figure 9B:
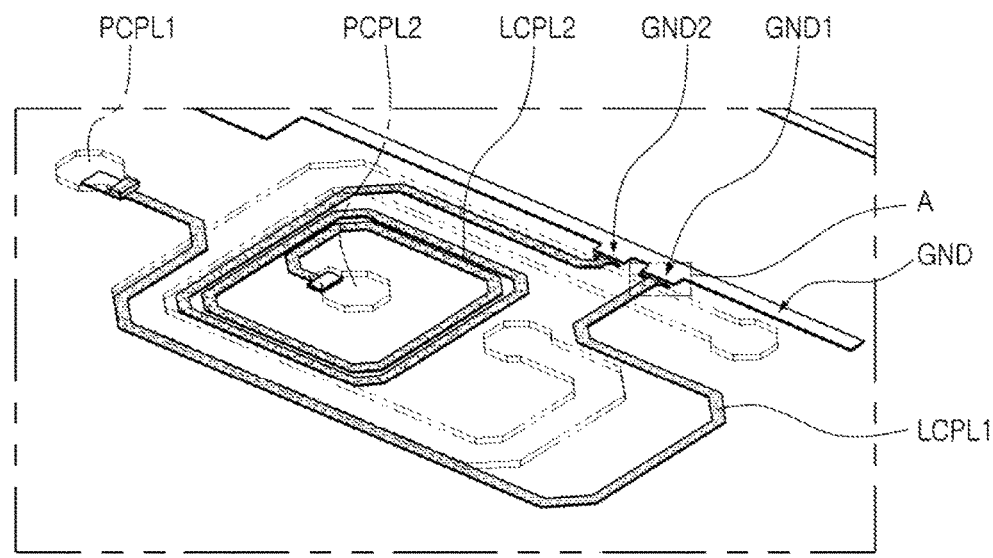
Figure 9C:
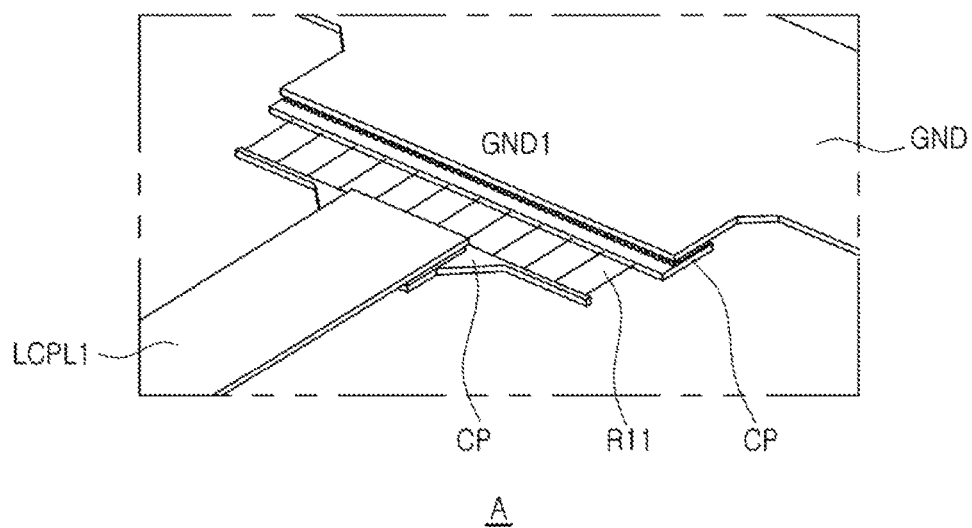

FIGS. 9A through 9C are schematic views illustrating the coupler of FIG. 2. FIG. 9A is a perspective view of the coupler 120. FIG. 9B is a view illustrating the first and second coupling wirings LCPL1 and LCPL2 of FIG. 9A. FIG. 9C is an enlarged view of the first coupling wiring LCPL1, the first resistor R11 (see FIG. 2), and a first ground GND1.

Referring to FIGS. 9A and 9B, the signal wiring Lant is disposed on a first layer, the first and second coupling wirings LCPL1 and LCPL2 are disposed on a second layer, and the first and second resistors, first and second grounds GND1 and GND2, and a ground part GND of the insulating layer are disposed on a third layer.

The second layer is disposed below the first layer, and the third layer may be disposed below the second layer. Wirings between the first and second layers and signal wirings (or ground wirings) of the second and third layers are electrically connected to each other through conductive vias. In an example, the first and second resistors disposed on the third layer are electrically connected to corresponding coupling wirings and a ground by a conductor pattern CP.

In this embodiment, the first and second coupling wirings LCPL1 and LCPL2 are disposed on a layer different from a layer on which the ground part GND is disposed, such that a distance between the first and second coupling wirings LCPL1 and LCPL2 and the ground part GND in the integrated circuit is relatively increased. Therefore, isolation between the first and second coupling wirings LCPL1 and LCPL2 and the ground part GND is improved.

In FIGS. 9A through 9C, a coupler structure including the signal wiring Lant and the first and second coupling wirings LCPL1 and LCPL2 is only an example, and the various embodiments are not limited thereto.

Furthermore, the resonant frequency Fres of the first coupling wiring LCPL1 is determined based on the capacitance Coff of the first shunt switch circuit SW1-2 in the switch-off state, and a mutual capacitance Cm and a mutual inductance Lm between the signal wiring Lant and the first coupling wiring LCPL1. In an example, the inductance of the first coupling wiring LCPL1 is the mutual inductance. This will be described with reference to FIG. 10.

Figure 10:
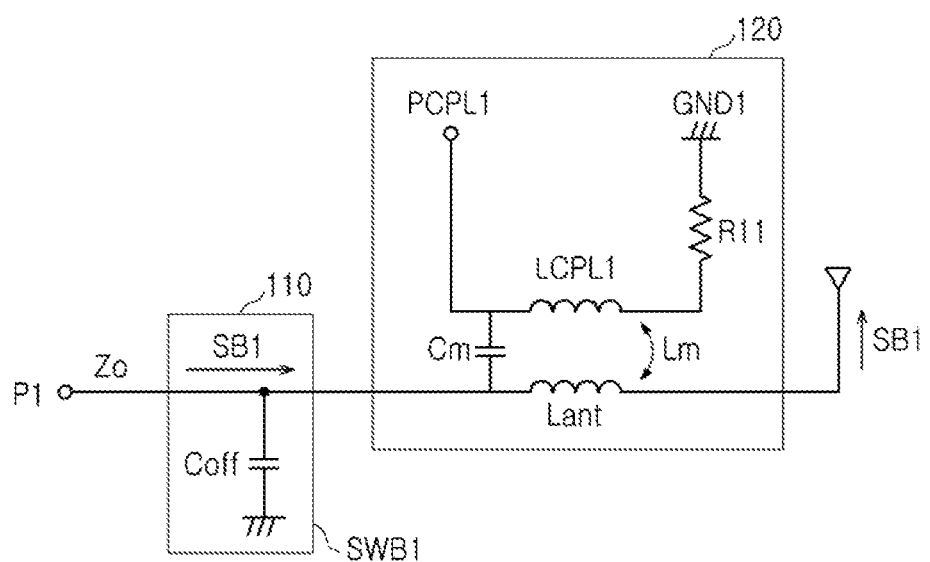
FIG. 10 is a view for describing the coupler of FIG. 1.

FIG. 10 is a view to describe the coupler of FIG. 1.

FIG. 10 is an equivalent circuit diagram of the coupler in the radio frequency switch circuit 100 in which the first band switch circuit SWB1 is in a switch-on state. The first band switch circuit SWB1 is the first band switch circuit of N-th band switch circuits of the radio frequency switch 110.

Referring to FIGS. 1 and 10, the coupler 120 includes the first coupling wiring LCPL1, which is represented as an inductor. In this case, the signal wiring Lant, between the common port Pcom of the radio frequency switch 110 and the antenna port Pant, is an inductor.

In this embodiment, the first coupling wiring LCPL1 and the signal wiring Lant are disposed adjacent to each other and coupled to each other, such that a mutual capacitance Cm and a mutual inductance Lm is formed between the first coupling wiring LCPL1 and the signal wiring Lant.

The resonant frequency Fres of the coupler 120 is determined as represented by the following Equation 1:

$$Fres = \frac{1}{2\pi * Coff}\left(\sqrt{\frac{Cm}{Lm}} - \frac{1}{Zo}\right). \quad \text{[Equation 1]}$$

Here, Coff is a capacitance of the first shunt switch circuit SW1-2 in the switch-off state, Cm is the mutual capacitance between the signal wiring Lant and the first coupling wiring LCPL1, Lm is the mutual inductance between the signal wiring Lant and the first coupling wiring LCPL1, and Zo is an intrinsic impedance (a line intrinsic impedance) of the first signal port P1.

Referring to Equation 1, in the radio frequency switch apparatus having a built-in coupler, a switch in a switch-off state in the radio frequency switch circuit is represented by a capacitance Coff. In addition, in Equation 1, a coupling factor and an isolation value of the coupler are set using the mutual capacitance Cm and the mutual inductance Lm, and the capacitance Coff has an influence on a resonant point of the coupling factor and the isolation of the coupler. In consideration of this, the mutual capacitance Cm and the mutual inductance Lm are determined.

As an example, in an example in which the resonant frequency of the coupler is set to coincide with a use frequency, excellent coupling characteristics may be secured.

In addition, referring to FIG. 10, a level at which an original signal interferes and is viewed in the coupler 120, when a signal input through the first signal port P1 is transmitted through an antenna connected to the antenna port, is called a 'coupling factor'. A level at which a signal is viewed in the coupler 120 when the signal is received in a reverse direction (from the antenna port to the first signal port P1) is called 'isolation.' In this case, because the isolation is an undesired signal, the lower the isolation, the better.

In addition, a phase difference depending on a direction of the coupler may be present in coupling by the mutual inductance Lm, different than in the case of coupling by the mutual capacitance Cm. The coupling factor and the isolation as described above may be represented by the following Equations 2 and 3:

$$CouplingFactor = \frac{Vcpl}{Vinput} = \frac{1}{2}\left(jwZo * Cm + jw\frac{Lm}{Zo}\right) \quad \text{[Equation 2]}$$

$$isolation = \frac{Visolation}{Vinput} = \frac{1}{2}\left(jwZo * Cm - jw\frac{Lm}{Zo}\right). \quad \text{[Equation 3]}$$

Here, Vcpl is a coupling voltage, Vinput is an input voltage input through the first signal port P1, Voutput is an output voltage output through the antenna port, and w is an angular frequency (=$2\pi f$ (here, f is a frequency)).

It may be appreciated from Equations 2 and 3 that the coupling factor and the isolation may be determined based on the mutual capacitance Cm and the mutual inductance Lm.

Figure 11A:
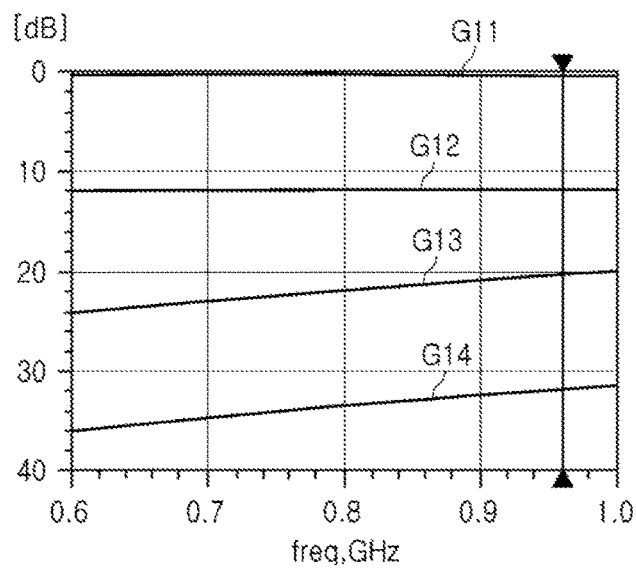
FIGS. 11A and 11B are graphs illustrating performance of a coupler formed on a printed circuit board, and performance of an integrated circuit (IC) built-in coupler, according to an embodiment, respectively.
Figure 11B:
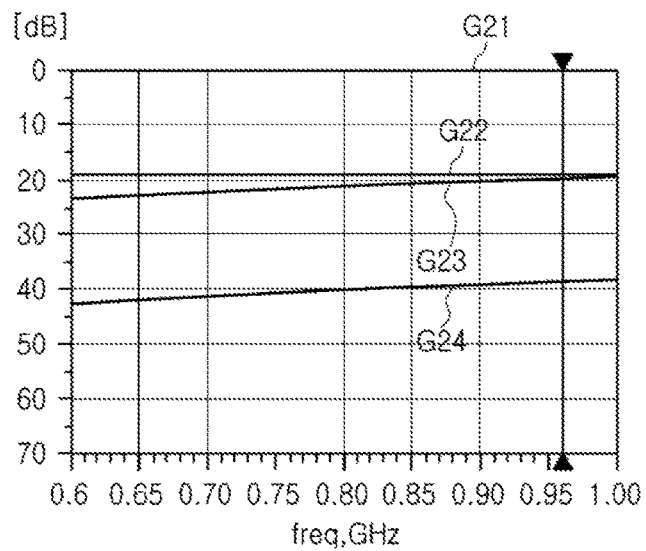

FIG. 11A is a graph illustrating non-ideal performance of a coupler formed on a printed circuit board. FIG. 11B is a graph illustrating an ideal performance of an integrated circuit (IC) built-in coupler in accord with an embodiment.

In FIG. 11A, G11 is a graph illustrating insertion loss characteristics, G12 is a graph illustrating directivity characteristics, G13 is a graph illustrating the characteristics of a coupling factor, and G14 is a graph illustrating the characteristics of isolation.

In addition, in FIG. 11B, G21 is a graph illustrating insertion loss characteristics, G22 is a graph illustrating directivity characteristics, G23 is a graph illustrating the characteristics of a coupling factor, and G24 is a graph illustrating the characteristics of isolation.

As an example, when comparing performances of the couplers at 960 MHz with each other, marked in FIGS. 11A and 11B, G11 is −0.24 [dB], G12 is −11.69 [dB], G13 is −20.22 [dB], and G14 is −31.92 [dB] in FIG. 11A, and G21 is −0.17 [dB], G22 is −19.06 [dB], G23 is −19.31 [dB], and G24 is −38.37 [dB] in FIG. 11B.

It may be appreciated from FIGS. 11A and 11B that performance of an ideal IC-based coupler, according to an embodiment, is improved when compared to performance of a non-ideal PCB-based coupler. For example, insertion loss was increased from −0.24 [dB] to −0.17 [dB] by 0.07 [dB].

In addition, a space of about 90% may be saved in the IC-based coupler, according to an embodiment, compared to the non-ideal PCB-based coupler.

The radio frequency switch circuit and apparatus having a built-in coupler, according to an embodiment as described above, may be used for a frequency division multiplexing (FDM) communications scheme, but may also be appropriate for a time division multiplexing (TDM) communications scheme.

The TDM communications scheme is a scheme to detect signals through a signal wiring, which is a common communications wiring, without using signal wirings for each band paths. This communications scheme has at least an advantage in terms of corresponding size and cost, and specific band signals are transmitted and received at any one point in time in the TDM communications scheme such that the signals are more accurately detected through the signal wiring, which is a common communications wiring in the TDM communications scheme, in contrast with the FDM communications scheme.

As set forth above, according to an embodiment, a coupler is built in a radio frequency switch to implement an integrated circuit (IC), where an area occupied by the coupler and the size of the coupler is decreased, and signal loss is decreased when compared to a coupler formed of a PCB-based pattern.

Because one coupler is disposed between the common port of the radio frequency switch and the antenna port, the radio frequency switch circuit having a built-in coupler according to an embodiment, can include one coupler compared to other circuits, in which couplers are disposed in each of a number of band paths. Some of the many advantages of the radio frequency switch circuit having a built-in coupler, according to the embodiment, is smaller in the area to be occupied by the coupler and a manufacturing cost of the coupler is reduced, and signals may be detected through the coupler immediately before transmitting the signals through the antenna, and thus, the signals are more accurately detected.

In addition, capacitances of switch devices in a switch-off state, among switch devices included in the radio frequency switch, are used to allow a resonant frequency to coincide with a corresponding band frequency, such that loss of the coupler is decreased, thus, improving performance characteristics of the coupler.

Further, signal and power loss of the coupler is decreased, thus, relatively decreasing power consumption.

While various embodiments have been shown and described above, it will be apparent after an understanding of the disclosure of this application that modifications and variations could be made without departing from the scope of the present application, as defined by the appended claims.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency switch circuit, comprising:
   a radio frequency switch comprising switch devices connected between a signal port and a common port; and
   a coupler comprising a first coupling wiring, disposed adjacent to a signal wiring formed between the common port of the radio frequency switch and an antenna port, and configured to form a first coupling signal with the signal wiring,
   wherein a resonant frequency of the coupler related to the first coupling wiring is dependent on
      a capacitance of switch devices in a switch-off state among the switch devices, and
      a mutual capacitance and a mutual inductance between the signal wiring and the first coupling wiring.

2. The radio frequency switch circuit of claim 1, wherein the radio frequency switch comprises first to N-th band switch circuits,
   wherein each of the first to N-th band switch circuits comprises
      a series switch circuit comprising one or more switch devices connected between a corresponding signal port of first to N-th signal ports and the common port, and
      a shunt switch circuit comprising one or more switch devices connected between a corresponding signal port of first to N-th signal ports and a ground, and
   wherein the resonant frequency of the coupler related to the first coupling wiring is dependent on the inductance of switch devices in a switch-off state among the switch devices and the mutual capacitance and the mutual inductance between the signal wiring and the first coupling wiring.

3. The radio frequency switch circuit of claim 1, wherein the coupler further comprises
   a second coupling wiring spaced apart from the first coupling wiring and adjacent to the signal wiring and the antenna port to form a second coupling signal with the signal wiring, and
   wherein a resonant frequency of the coupler related to the second coupling wiring is dependent on the mutual capacitance and the mutual inductance between the signal wiring and the second coupling wiring and a capacitance of switch devices in a switch-off state among the switch devices.

4. The radio frequency switch circuit of claim 3, wherein the first coupling wiring is a coupling wiring in a first direction for monitoring the signal transmission strength of a bidirectional coupler, the second coupling wiring is a coupling wiring in a second direction for monitoring the signal reception strength of the bidirectional coupler, opposite to the first direction of the bidirectional coupler.

5. The radio frequency switch circuit of claim 3, wherein the radio frequency switch comprises first to N-th band switch circuits,
wherein each of the first to N-th band switch circuits comprises
a series switch circuit comprising one or more switch devices connected between a corresponding signal port of first to N-th signal ports and the common port, and
a shunt switch circuit comprising one or more switch devices connected between a corresponding signal port of first to N-th signal ports and a ground, and
wherein the resonant frequency of the coupler related to the second coupling wiring is dependent on the mutual capacitance and the mutual inductance between the signal wiring and the second coupling wiring and a capacitance of switch devices in a switch-off state among the switch devices.

6. The radio frequency switch circuit of claim 1, wherein the resonant frequency of the coupler related to the first coupling wiring is the same as a frequency of the first band signal transmitted from the radio frequency switch to the coupler.

7. The radio frequency switch circuit of claim 2, wherein the resonant frequency of the coupler related to the first coupling wiring is based on $$Fres = \frac{1}{2\pi * Coff}\left(\sqrt{\frac{Cm}{Lm}} - \frac{1}{Zo}\right),$$

where Coff is a capacitance of switch devices in a switch-off state among the switch devices, Cm is a mutual capacitance between the signal wiring and the first coupling wiring, Lm is a mutual inductance between the signal wiring and the first coupling wiring, and Zo is an intrinsic impedance of the corresponding signal port.

8. The radio frequency switch circuit of claim 1, wherein the radio frequency switch and the coupler are implemented as a single integrated circuit.

9. A radio frequency switch circuit, comprising
a radio frequency switch comprising switch devices connected between a signal port and a common port; and
a coupler comprising
a signal wiring comprising one end connected to the common port and another end connected to an antenna port, and
a first coupling wiring disposed coextensive to the signal wiring to form a coupling with the signal wiring and configured to produce a first coupling signal,
wherein the radio frequency switch and the coupler are implemented as a single integrated circuit.

10. The apparatus of claim 9, wherein the coupler is directly connected to the radio frequency switch without a matching circuit.

11. The apparatus of claim 10, wherein the radio frequency switch comprises first to N-th band switch circuits,
wherein each of the first to N-th band switch circuits comprises
a series switch circuit comprising one or more switch devices connected between a corresponding signal port of first to N-th signal ports and the common port, and
a shunt switch circuit comprising one or more switch devices connected between a corresponding signal port of first to N-th signal ports and a ground, and
wherein a resonant frequency of the coupler related to the first coupling wiring is dependent on
a mutual capacitance and a mutual inductance between the signal wiring and the first coupling wiring, and
a capacitance of switch devices in a switch-off state among the switch devices.

12. The radio frequency switch circuit of claim 11, wherein the coupler further comprises
a second coupling wiring spaced apart from the first coupling wiring and adjacent to the signal wiring and the antenna port to form a second coupling signal with the signal wiring, and
wherein a resonant frequency of the coupler related to the second coupling wiring is dependent on the mutual capacitance and the mutual inductance between the signal wiring and the second coupling wiring and a capacitance of switch devices in a switch-off state among the switch devices.

13. The radio frequency switch circuit of claim 11, wherein the first coupling wiring is a coupling wiring in a first direction for monitoring the signal transmission strength of the bidirectional coupler, and the second coupling wiring is a coupling wiring in a second direction for monitoring the signal reception strength of the bidirectional coupler, opposite to the first direction of the bidirectional coupler.

14. The radio frequency switch circuit of claim 9, wherein the resonant frequency of the coupler related to the first coupling wiring is the same as a frequency of the first band signal transmitted from the radio frequency switch to the coupler.

15. The radio frequency switch circuit of claim 11, wherein the resonant frequency of the coupler related to the first coupling wiring is based on $$Fres = \frac{1}{2\pi * Coff}\left(\sqrt{\frac{Cm}{Lm}} - \frac{1}{Zo}\right),$$

where Coff is a capacitance of switch devices in a switch-off state among the switch devices, Cm is a mutual capacitance between the signal wiring and the first coupling wiring, Lm is a mutual inductance between the signal wiring and the first coupling wiring, and Zo is an intrinsic impedance of the corresponding signal port.

16. A radio frequency switch apparatus, comprising:
a radio frequency switch comprising switch devices connected between a signal port and a common port, and configured to switch a first band signal;
a coupler comprising a first coupling wiring disposed adjacent to a signal wiring formed between the inter-stage matching circuit and an antenna port to form a first coupling signal with the signal wiring; and an interstage matching circuit connected to the common port and configured to perform impedance matching between the radio frequency switch and the coupler, wherein a resonant frequency of the coupler related to the first coupling wiring is dependent on a capacitance of switch devices in a switch-off state among the switch devices, and a mutual capacitance and a mutual inductance between the signal wiring and the first coupling wiring.

17. The radio frequency switch apparatus of claim 16, wherein the radio frequency switch comprises first to N-th band switch circuits, wherein each of the first to N-th band switch circuits comprises a series switch circuit comprising one or more switch devices connected between a corresponding signal port of first to N-th signal ports and the common port, and a shunt switch circuit comprising one or more switch devices connected between a corresponding signal port of first to N-th signal ports and a ground, and wherein the resonant frequency of the coupler related to the first coupling wiring is dependent on a mutual capacitance and a mutual inductance between the signal wiring and the first coupling wiring and a capacitance of switch devices in a switch-off state among the switch devices.

18. The radio frequency switch apparatus of claim 16, wherein the coupler further comprises a second coupling wiring spaced apart from the first coupling wiring, and adjacent to the signal wiring and the antenna port to form a second coupling signal with the signal wiring, and wherein a resonant frequency of the coupler related to the second coupling wiring is dependent on a capacitance of switch devices in a switch-off state among the switch devices, and a mutual capacitance and a mutual inductance between the signal wiring and the second coupling wiring.

19. The radio frequency switch apparatus of claim 18, wherein the radio frequency switch comprises first to N-th band switch circuits, wherein each of the first to N-th band switch circuits comprises a series switch circuit comprising one or more switch devices connected between a corresponding signal port of first to N-th signal ports and the common port, and a shunt switch circuit comprising one or more switch devices connected between a corresponding signal port of first to N-th signal ports and a ground, and wherein the resonant frequency of the coupler related to the second coupling wiring is dependent on a capacitance of switch devices in a switch-off state among the switch devices, and a mutual capacitance and a mutual inductance between the signal wiring and the second coupling wiring.

20. The radio frequency switch apparatus of claim 16, wherein the resonant frequency of the coupler related to the first coupling wiring is the same as a frequency of the first band signal transmitted from the radio frequency switch to the coupler.

21. The radio frequency switch apparatus of claim 17, wherein the resonant frequency of the coupler related to the first coupling wiring is dependent on $$Fres = \frac{1}{2\pi * Coff}\left(\sqrt{\frac{Cm}{Lm}} - \frac{1}{Zo}\right),$$

where Coff is a capacitance of switch devices in a switch-off state among the switch devices, Cm is the mutual capacitance between the signal wiring and the first coupling wiring, Lm is the mutual inductance between the signal wiring and the first coupling wiring, and Zo is an intrinsic impedance of the corresponding signal port.

22. The radio frequency switch apparatus of claim 16, wherein the radio frequency switch and the coupler are implemented as a single integrated circuit.

* * * * *